(12) United States Patent
Chakrapani et al.

(10) Patent No.: US 7,952,212 B2
(45) Date of Patent: May 31, 2011

(54) APPLICATIONS OF SMART POLYMER COMPOSITES TO INTEGRATED CIRCUIT PACKAGING

(75) Inventors: Nirupama Chakrapani, Chandler, AZ (US); James Chris Matayabas, Jr., Chandler, AZ (US); Vijay Wakharkar, Paradise Valley, AZ (US)

(73) Assignee: Intel Corporation, Santa Clara, CA (US)

( * ) Notice: Subject to any disclaimer, the term of this patent is extended or adjusted under 35 U.S.C. 154(b) by 424 days.

(21) Appl. No.: 11/479,105

(22) Filed: Jun. 30, 2006

(65) Prior Publication Data
US 2010/0237513 A1    Sep. 23, 2010

(51) Int. Cl.
*H01L 23/29*    (2006.01)
(52) U.S. Cl. .................. 257/789; 257/792; 257/795
(58) Field of Classification Search .................. 257/789, 257/792, 795, E21.503
See application file for complete search history.

(56) References Cited

U.S. PATENT DOCUMENTS

| 6,730,541 B2 | 5/2004 | Heinen et al. |
| 7,013,965 B2 * | 3/2006 | Zhong et al. .................. 165/185 |
| 7,025,607 B1 | 4/2006 | Das et al. |
| 2005/0221605 A1 | 10/2005 | Koning |

FOREIGN PATENT DOCUMENTS

KR    1020050101919 A    10/2005

OTHER PUBLICATIONS

International Search Report and Written Opinion for PCT/US2007/015266 mailed Oct. 19, 2007, 10 pages.
International Report on Patentability for PCT/US2007/015266 mailed Jan. 15, 2009 (6 pgs.)

* cited by examiner

*Primary Examiner* — Hung Vu
(74) *Attorney, Agent, or Firm* — Kenneth A. Nelson

(57) ABSTRACT

Applications of smart polymer composites to integrated circuit packaging.

12 Claims, 10 Drawing Sheets

US 7,952,212 B2

APPLICATIONS OF SMART POLYMER COMPOSITES TO INTEGRATED CIRCUIT PACKAGING

TECHNICAL FIELD

The invention relates to the field of microelectronics and more particularly, but not exclusively, to application of nanoparticle filled composites to integrated circuit packaging.

BACKGROUND

The evolution of integrated circuit designs has resulted in higher operating frequency, increased numbers of transistors, and physically smaller devices. This continuing trend has generated ever increasing area densities of integrated circuits and electrical connections. To date, this trend has also resulted in both increasing power and increasing heat flux devices, and the trend is expected to continue into the foreseeable future. Further, materials used in electronic packaging typically have various coefficients of thermal expansion. Under temperature fluctuations induced by normal usage, storage, and manufacturing conditions, the various coefficients of thermal expansion may lead to mechanical failures such as material cracking (cohesive failure) and delamination in a region of adjoining materials (adhesive failure). Still further, mechanical failures may be induced by many other causes, e.g. exposure to shock and vibration during shipping to a system or motherboard integrator, system or motherboard assembly, or shock and vibration during delivery to the end customer.

For example, solder bumps often electrically and mechanically couple an integrated circuit die to a package substrate. Further, the package substrate may be electrically and mechanically coupled to a printed circuit board by solder balls. The package substrate may have a coefficient of thermal expansion different from the die and/or the printed circuit board. Under a change in temperature, a mechanical stress may result within the solder balls and solder bumps due to various coefficients of thermal expansion. In some circumstances, the solder balls and solder bumps crack (cohesive failure) under the thermally induced stress. Once a crack initiates, the cohesive failure may propagate at a rate partially dependent on a characteristic dimension of the crack, e.g., diameter at the tip of the crack.

One existing method of preventing solder ball and solder bump cracking includes dispensing a curable material in the regions between the solder balls and solder bumps ("underfilling"). When an underfill is used, some of the stress otherwise taken by the solder balls and solder bumps is taken by the underfill material and thereby reduces the likelihood of solder ball or solder bump cracking. In applications that use presently available technology, if a crack initiates within the underfill, the crack may propagate through the underfill and through the solder ball and solder bump. Often underfill materials are brittle and cracks may propagate readily once initiated. Another existing technology uses underfill materials with increased toughness to slow crack propagation. Some methods of increasing underfill composite toughness include adding a second phase to the cured composite, for example through using any of a variety of rubber additives or loading the composite with particulate inorganic fillers. Though a crack in a brittle underfill may propagate more rapidly than in a toughened material, even a crack in a tough underfill material may still propagate.

In other circumstances, adjoining layers of material within the package may delaminate due to a mechanical stress transferred through the solder balls and solder bumps. Similar to a cohesive failure, an adhesive failure may propagate at a rate partially dependent on a characteristic dimension of the region of delamination. Characteristically poor metal—polymer adhesion exacerbates adhesive failure propagation. One well known method of partially managing delamination failures includes applying an adhesive coating to a material interface. Alternative methods of enhancing adhesive properties of polymer and metal combinations include surface roughening or adding coupling agents, e.g., silyl ethers. Similar to crack propagation, delamination may more readily propagate when an interface coating is brittle than when the interface coating is tough. Likewise, while delamination propagation in a tough interface coating may be slower than in a brittle interface coating, the adhesive failure may still propagate.

Material cracking and delamination may occur under circumstances other than expansion and contraction due to temperature cycling. Circumstances under which cracking and delamination failures may occur are many and include, for example, dynamic warpage of the package during use, fatigue from temperature cycling, and shock and vibration arising through shipping, assembly, and handling.

DETAILED DESCRIPTION

Herein disclosed are a method of using, and an apparatus and system including, smart polymer composites.

In the following detailed description, reference is made to the accompanying drawings which form a part hereof, wherein like numerals designate like parts throughout and in which are shown, by way of illustration, specific embodiments in which the invention may be practiced. Other embodiments may be utilized and structural or logical changes may be made without departing from the intended scope of the embodiments presented. It should also be noted that directions and references (e.g., up, down, top, bottom, primary side, backside, etc.) may be used to facilitate the discussion of the drawings and are not intended to restrict the application of the embodiments of this invention. Therefore, the following detailed description is not to be taken in a limiting sense and the scope of the embodiments of the present invention is defined by the appended claims and their equivalents.

Smart Polymer Composites

Reference to "filler" means a bulk material that consists of individual particles incorporated in, or dispersed substantially throughout, another material. Often, use of a filler results in modification of one or more bulk material properties of the material incorporating the filler.

Reference to "nanoparticle" means a particle with a characteristic length of about 500 nanometer (nm) or less, in contrast to larger micro-particles.

Reference to "smart polymer composite" means a polymer composite that includes a nanoparticle filler, mobile within the polymer composite. In some embodiments of a smart polymer composite, the nanoparticle filler will respond to an external stimulus, e.g., creation of a high energy surface, an electrical impulse, a change in temperature, or a magnetic impulse.

Figure 1:
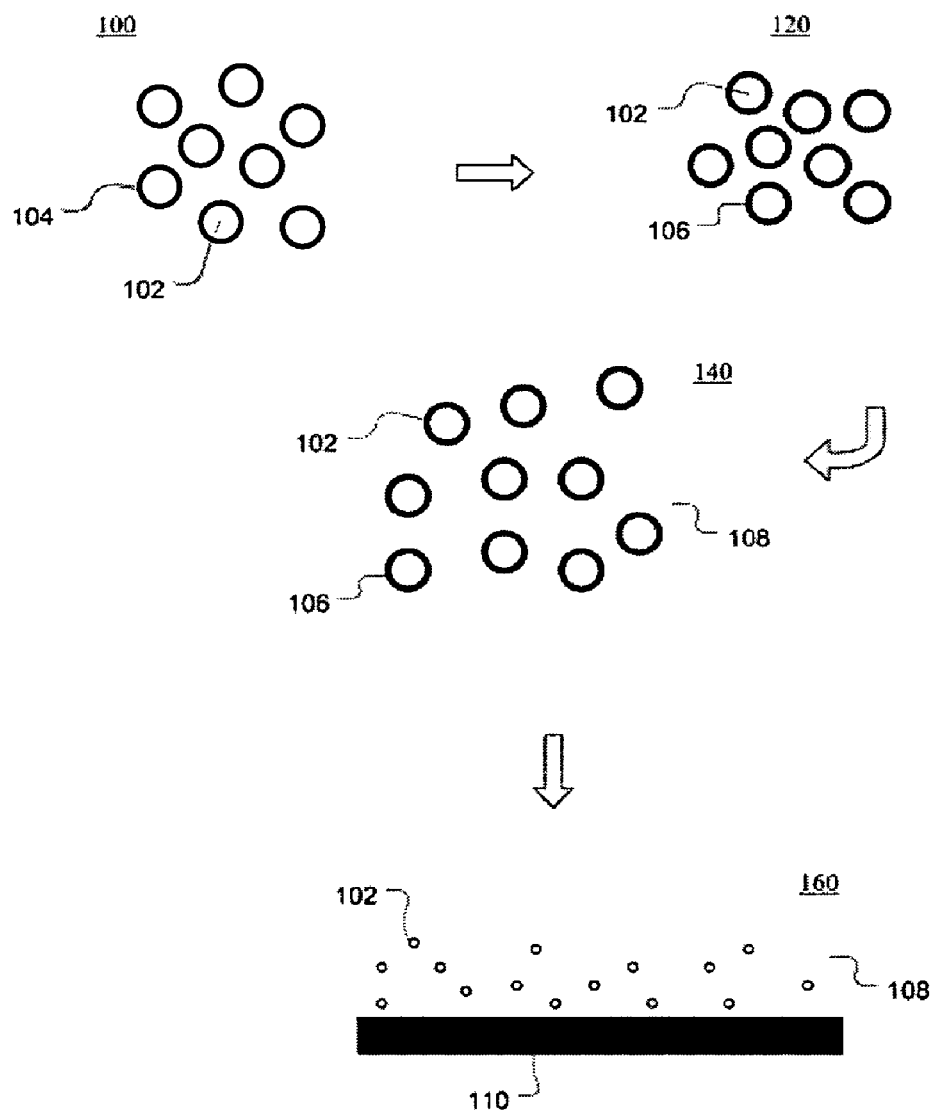
FIG. 1 illustrates a smart polymer composite at various stages in packaging an integrated circuit.

FIG. 1 illustrates a smart polymer composite 140 at various stages in packaging an integrated circuit. A smart polymer composite 140 may be formed by dispersing unmodified mobile nanoparticle filler material 100, in which a surface 104 of individual nanoparticles 102 are unmodified, or modified mobile nanoparticle filler material 120, in which a surface 106 of invidudal nanoparticles 102 are modified, substantially throughout a polymer matrix 108. Subsequent to formation, the smart polymer composite 140 may adjoin a different material 110 in an integrated circuit package 160.

Thermosets such as epoxy, bismaleimide, thermosetting urethanes, cyanourate esters, silicones, or Thermoplastics such as polyimide, liquid crystalline polymers or similar materials may form the polymer matrix 108. Such materials may be a solid or a liquid resin. A nanoparticle filler 100 or 120 may be organic, inorganic, or metallic. For example, a nanoparticle filler 100 or 120 material may be silica, alumina, zirconia, titania, carbon nanotubes, or a combination thereof.

Figure 2:
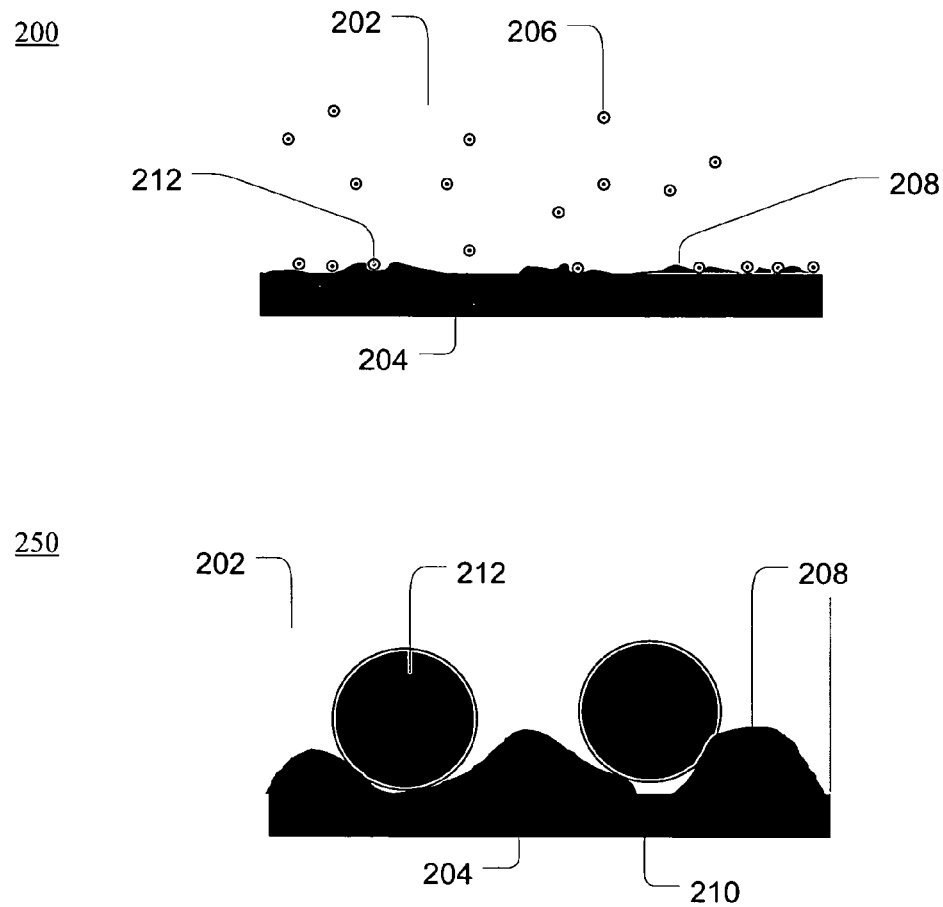
FIG. 2 illustrates a possible mechanism for enhanced adhesion between adjoining materials in an integrated circuit package where one of the materials includes a smart polymer composite.

Smart polymer composites exhibit enhanced adhesion with adjoining organic, inorganic (e.g., silicon), or metallic (e.g., copper) materials as compared to adhesion which would occur using a polymer without nanoparticle filler. FIG. 2 illustrates a possible mechanism for enhanced adhesion in regions 200 (detail 250) where one of the materials includes a smart polymer composite. The polymer matrix 202 with a dispersion of nanoparticles 206 adjoins a material 204. The surface roughness of the adjoining material 204 is illustrated by ridges 208 and valleys 210. Enhanced adhesion may result from mechanical interlocking of nanoparticles 212 with the ridges 208 and valleys 210.

Figure 10:
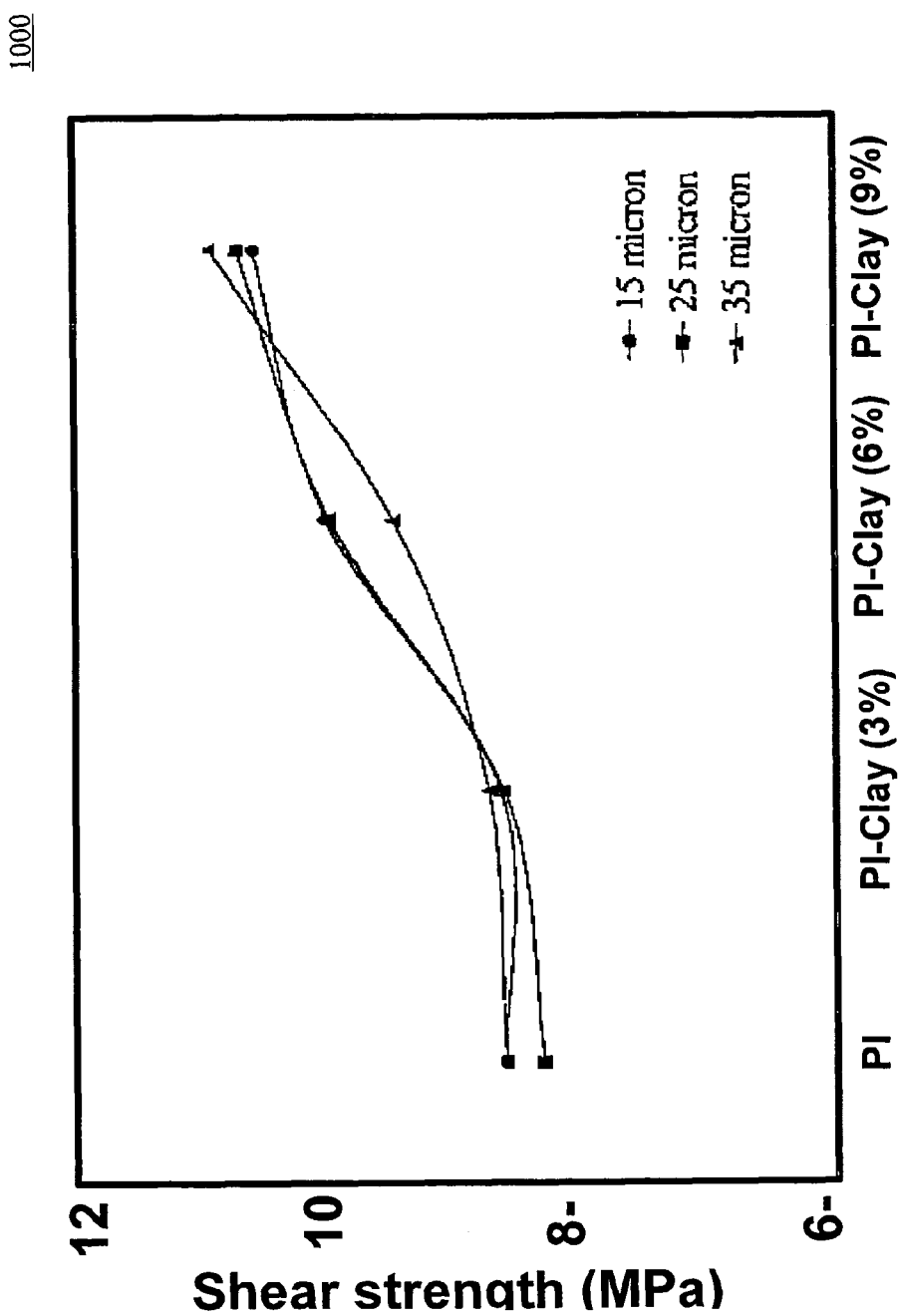
FIG. 10 illustrates a graph of bond shear strength in a bond between polyimide and silicon for various sizes and quantities of nanoparticle filler in the polyimide matrix.

Alternatively, enhanced adhesion may occur partially due to surface chemistry. For example, adhesion between a smart polymer composite and an adjoining material 204 with low surface roughness may exhibit enhanced adhesion even as compared to a polymer composite with larger micro-scale filler material and larger surface roughness. Smart polymer composites have higher surface energy at bulk material boundaries than do polymers, even those with the same loading of micro- (as opposed to nano-particle fillers. The higher surface energy of smart polymer composites may result in increased adhesion. Nanoparticle fillers have higher surface energy (very high surface-to-volume ratio) which could account for the overall increase in the surface energy of the smart polymer composite at bulk material boundaries and observed adhesion enhancement. Adhesion can be further improved by treating the adjoining materials with plasma. FIG. 10 illustrates a graph 1000 of bond shear strength in a bond between a smart polymer composite (with a polyimide matrix) and silicon for various sizes and quantities of clay nanoparticle filler.

Nanoparticles can migrate within smart polymer composites by virtue of the nanoparticle's small geometry in relation to the chain relaxation length of the surrounding polymer matrix. Nanoparticle mobility may require that the polymer matrix be above its glass transition temperature. As mentioned, nanoparticles have high surface-to-volume ratios and thereby possess higher surface energy than conventional fillers. High surface energy in conjunction with conformational strain induced by the particles on the polymer chain may be some of the driving forces behind nanoparticle migration to high energy interfaces. Different combinations of nanoparticle filler material and polymer matrix material may exhibit different nanoparticle mobility because interfacial chemistry between filler and polymer may enhance or retard mobility. Nanoparticle mobility may be triggered at will through application of stimuli such as modified surface energy, change in temperature, or an electrical or magnetic impulse. For example, nanoparticles could have a surface charge that could be used to trigger their mobility.

Mobility of a nanoparticle filler may be further enhanced through modification of an interfacial surface of the nanoparticle filler, the polymer matrix, or both. Compatiblizing a nanoparticle surface with the matrix polymer or cross-linking the filler with the matrix using pre-existing functional groups (e.g., silanols on silica) could enhance nanoparticle mobility, thereby improving performance of the smart polymer composite.

Figure 3:
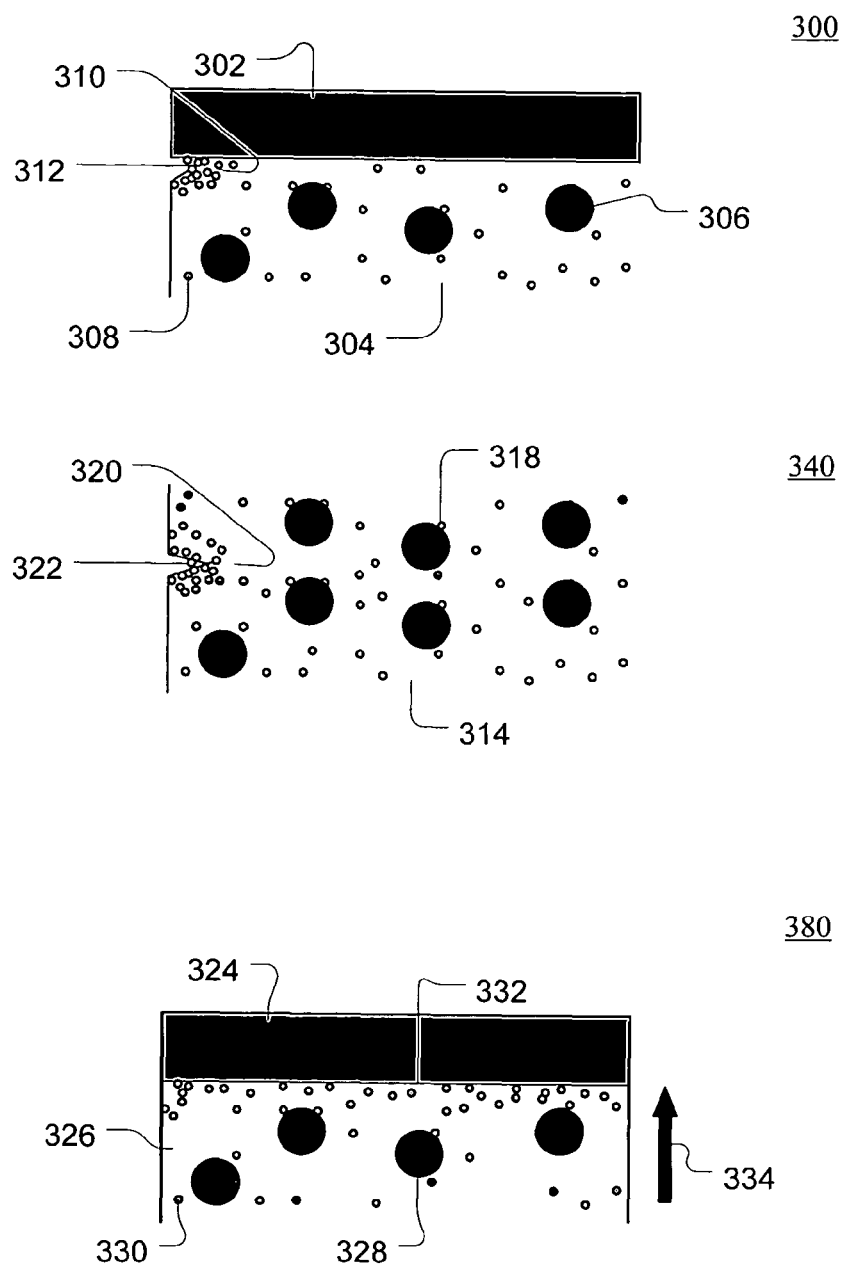
FIG. 3 illustrates non-uniform dispersion of mobile nanoparticles in a smart polymer composite under an adhesive failure, a cohesive failure, and under use to improve interfacial adhesion in a region of adjoining materials of different composition

FIG. 3 illustrates exemplary concentrations of nanoparticle filler 308, 318, 330 within a polymer matrix 304, 314, 326 exposed to an adhesive failure 312, a cohesive failure 422, and a region of a smart polymer composite and an adjoining material 324. The smart polymer composites of FIG. 3 also include a micro-particle filler 306, 318, 328, such as, for example, silica. Mobility of the nanoparticles 308, 318, 330 in the polymer matrix 304, 314, 326 leads in part to increased nanoparticle concentration in high energy regions 310, 320, 332.

Figure 7:
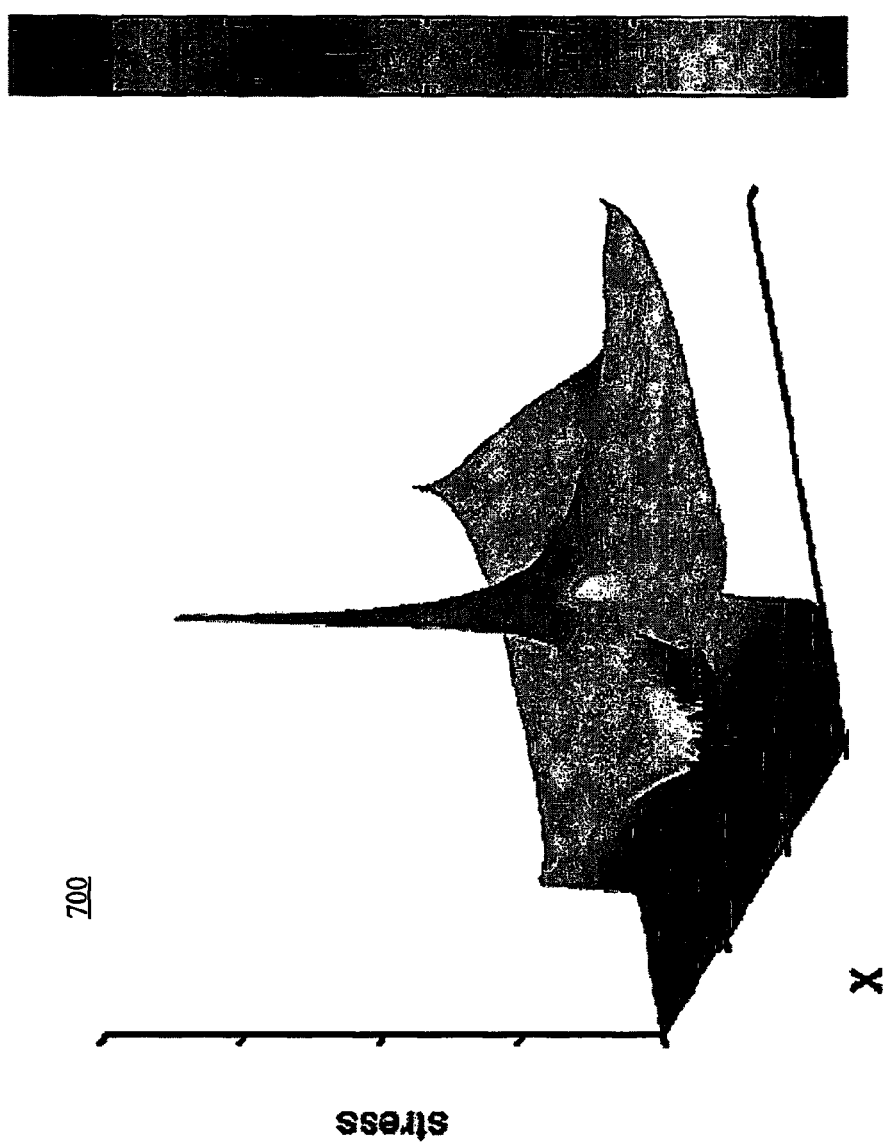
FIG. 7 illustrates a graph of mechanical stress in a region that includes a crack in a prior art composite material.
Figure 8:
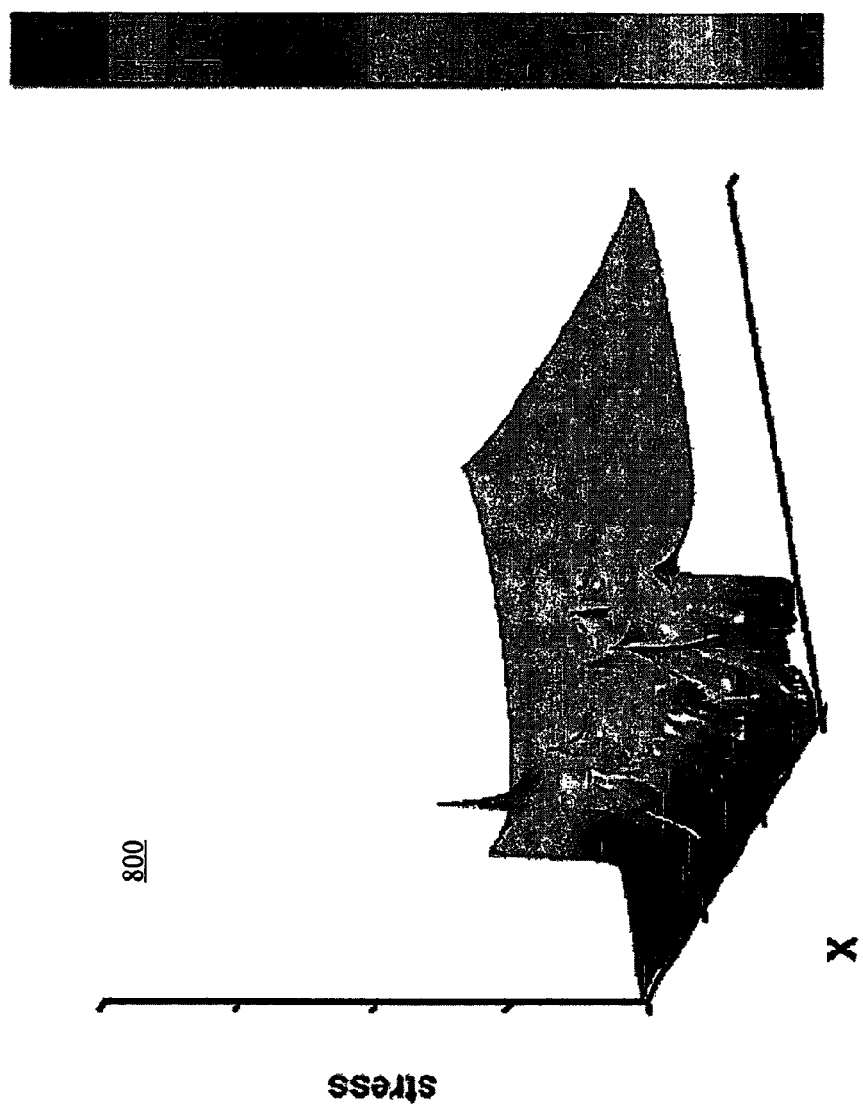
FIG. 8 illustrates a graph of mechanical stress in a region that includes a crack in a smart polymer composite.
Figure 9:
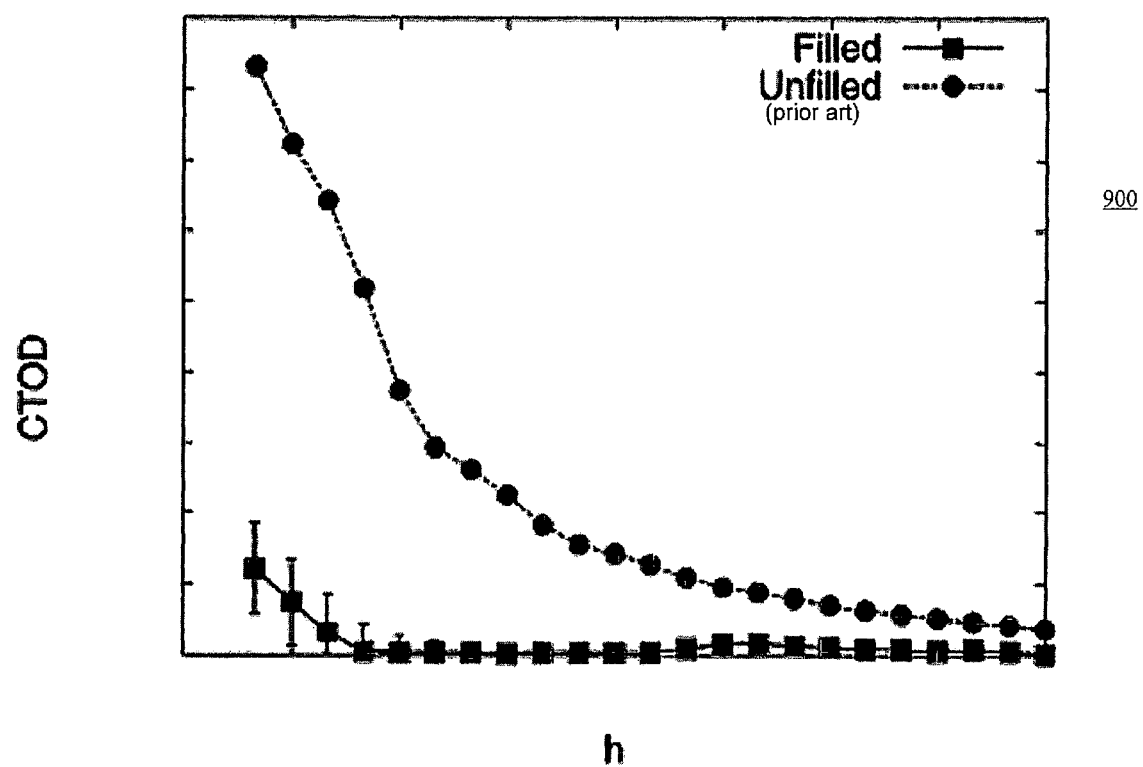
FIG. 9 illustrates a graph comparing Crack Tip Opening Displacement (CTOD) in a smart polymer composite coating to CTOD in a prior art polymer coating.

Some smart polymer composites may also self-heal cohesive or adhesive failures. Nanoparticles, due to their size, can repair very small cracks. For example, FIG. 3 illustrates an assembly 300 with an adhesive failure 312 and an assembly 340 with a cohesive failure. As mentioned, these regions of failure attract higher concentrations of nanoparticles which can blunt the crack and arrest propagation. Because nanoparticles may be smaller than the polymer radius of gyration but larger than the crack tip radius, they can get lodged at the crack tip. This prevents the crack from propagating. FIG. 7 illustrates a graph 700 of a stress field in a prior art polymeric material in a region that includes a crack. FIG. 8, by contrast, illustrates a graph 800 of a stress field, with significantly lower peak stress, in a smart polymer composite in a region that includes a crack. The reduced peak stress in FIG. 8 results from the nanoparticle filler arresting crack growth. FIG. 9 illustrates a graph 900 that shows a reduced crack tip opening displacement in a smart polymer composite ("filled") as compared to a prior art polymer ("unfilled").

Smart Polymer Composite Applications

Smart polymer composites may find successful application in a microelectronic package for an integrated circuit, e.g., a microprocessor, a multiple core microprocessor, a graphics processor, a memory controller, an ASIC, a chipset, and a combination thereof. For example, an integrated circuit package may use a bulk polymer for an underfill, a mold compound, an encapsulant other than a mold compound, a dielectric layer, a die attach, a sealant, or some combination. Alternatively, a bulk polymer could be used as a coating for regions of adjoining materials, such as between an underfill and a die passivation layer, to prevent delamination. A smart polymer composite may be used in lieu of, or in addition to, such bulk polymers in substantially similar ways.

Figure 4:
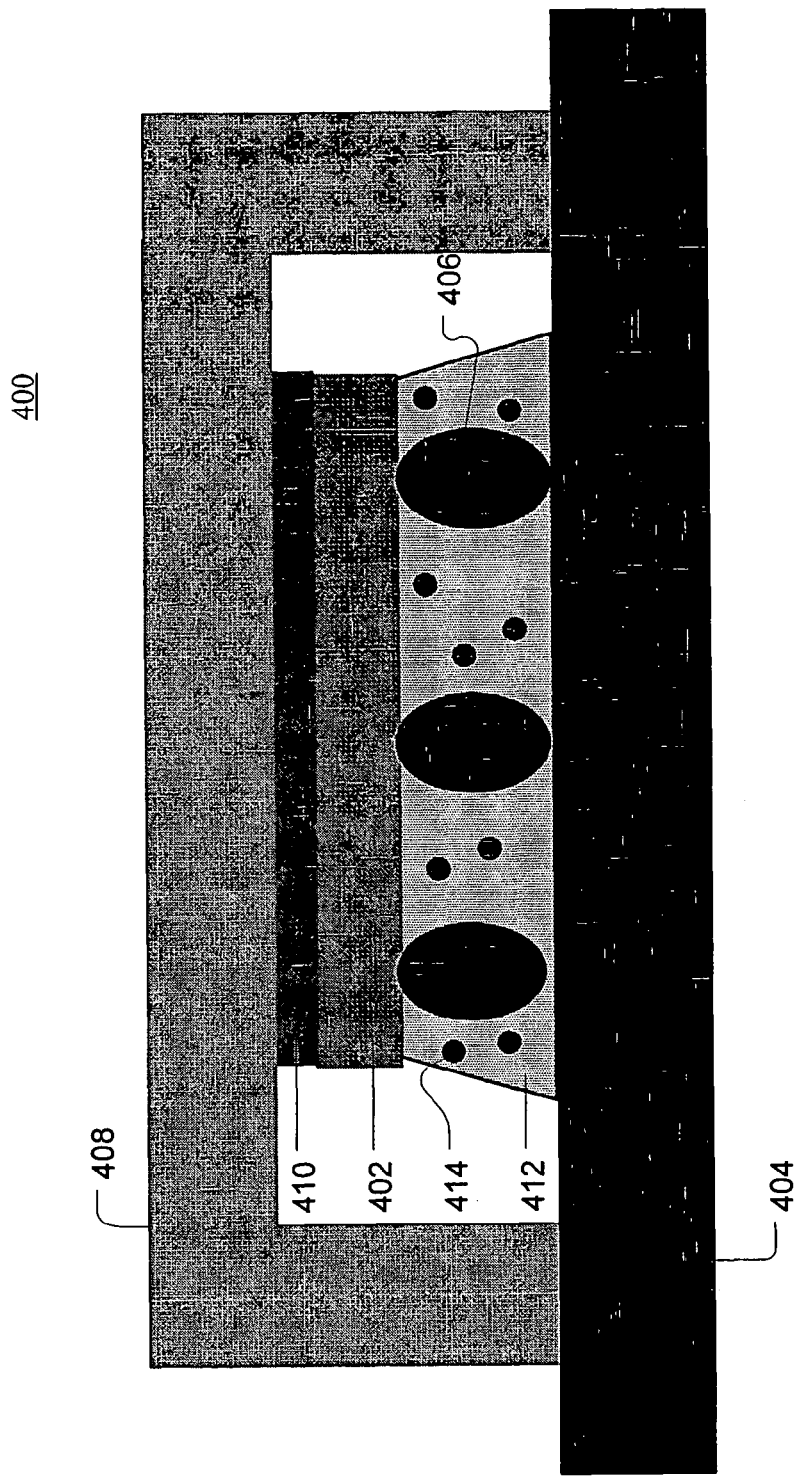
FIG. 4 illustrates a cross-sectional view of an integrated circuit package that includes a smart polymer composite underfill.

FIG. 4 illustrates one of many embodiments of a package 400 containing an integrated circuit and at least one region of adjoining materials of different composition. Such an embodiment may include a package substrate 404 electrically coupled to an integrated circuit die 402 through an array of solder bumps 406. The array of solder bumps 406 may form voids subsequently filled with an underfill material formed of a polymer matrix 412 with a dispersion of nanoparticles 414. Further, an integrated heat spreader 408 thermally coupled to the die 402 using a thermal interface material 410 may be present in an embodiment.

Alternatively, an integrated circuit package may incorporate a smart polymer composite applied as a surface coating or encapsulant to a region of adjoining, but different materials to retard delamination. For example, a region where a die attach adjoins a die provides one of many exemplary embodiments where a smart polymer composite might be applied to a region of adjoining, but different, materials. Other uses of smart polymer composites may include an underfill, a mold compound, an encapsulant other than a mold compound, a dielectric layer, a die attach, a sealant, a stress compensation layer, or some combination. In some uses, the nanoparticle filler may only make up less than about 20% by weight of the smart polymer composites.

In some instances, cracks may form in a smart polymer composite during manufacturing, shipping, handling, or normal use. However, nanoparticle fillers in smart polymer composites may arrest the cracks and prevent them from propagating, thereby improving package reliability.

Figure 5:
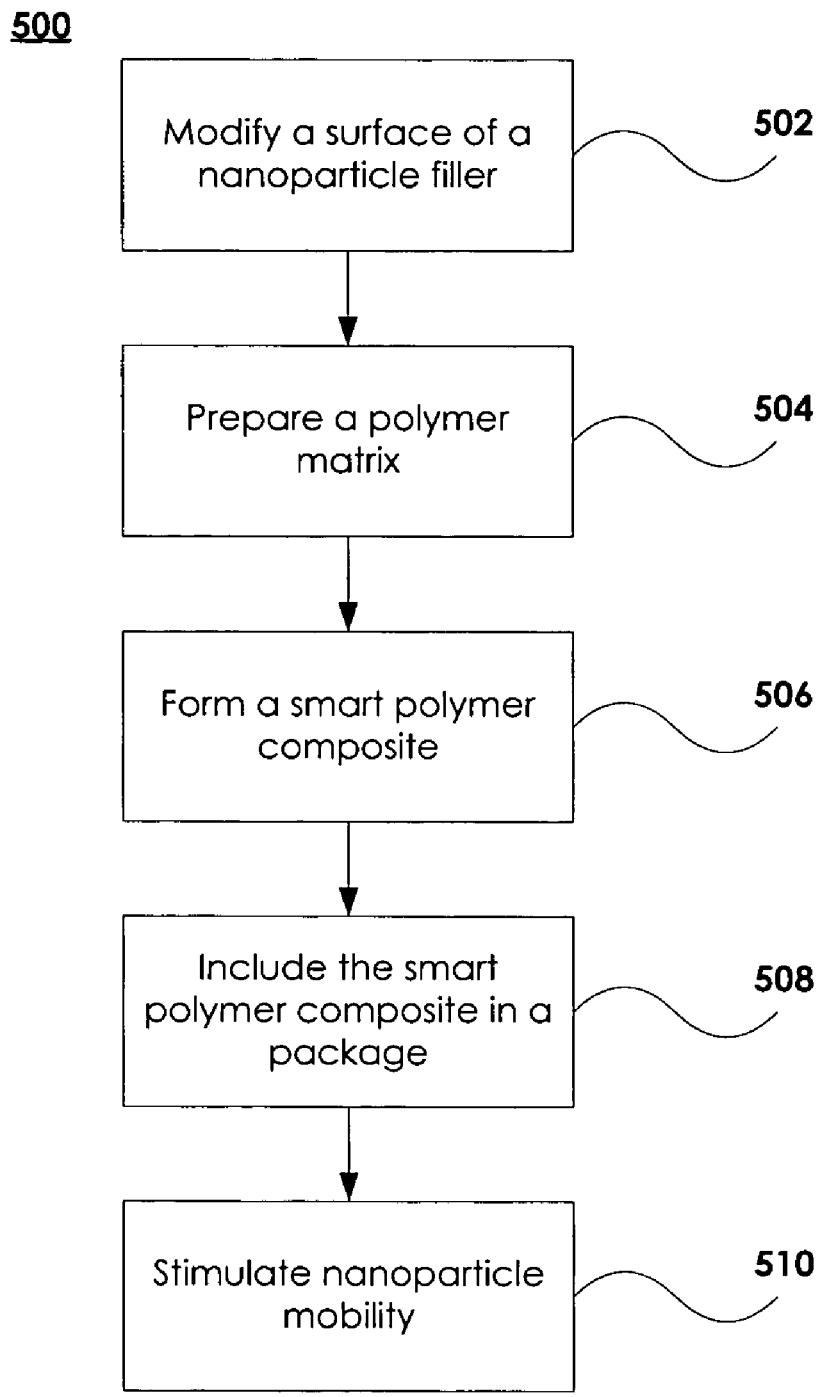
FIG. 5 illustrates a method of using a smart polymer composite in an integrated circuit package.

FIG. 5 illustrates a method of packaging an integrated circuit wherein the package incorporates the use of a smart polymer composite. The method 500 includes modifying a surface of a nanoparticle filler 502, preparing a polymer matrix 504, and forming a smart polymer composite 506 through combination of the nanoparticle filler and polymer matrix. The method further includes incorporating the smart polymer composite 508 and stimulating nanoparticle mobility 510.

Figure 6:
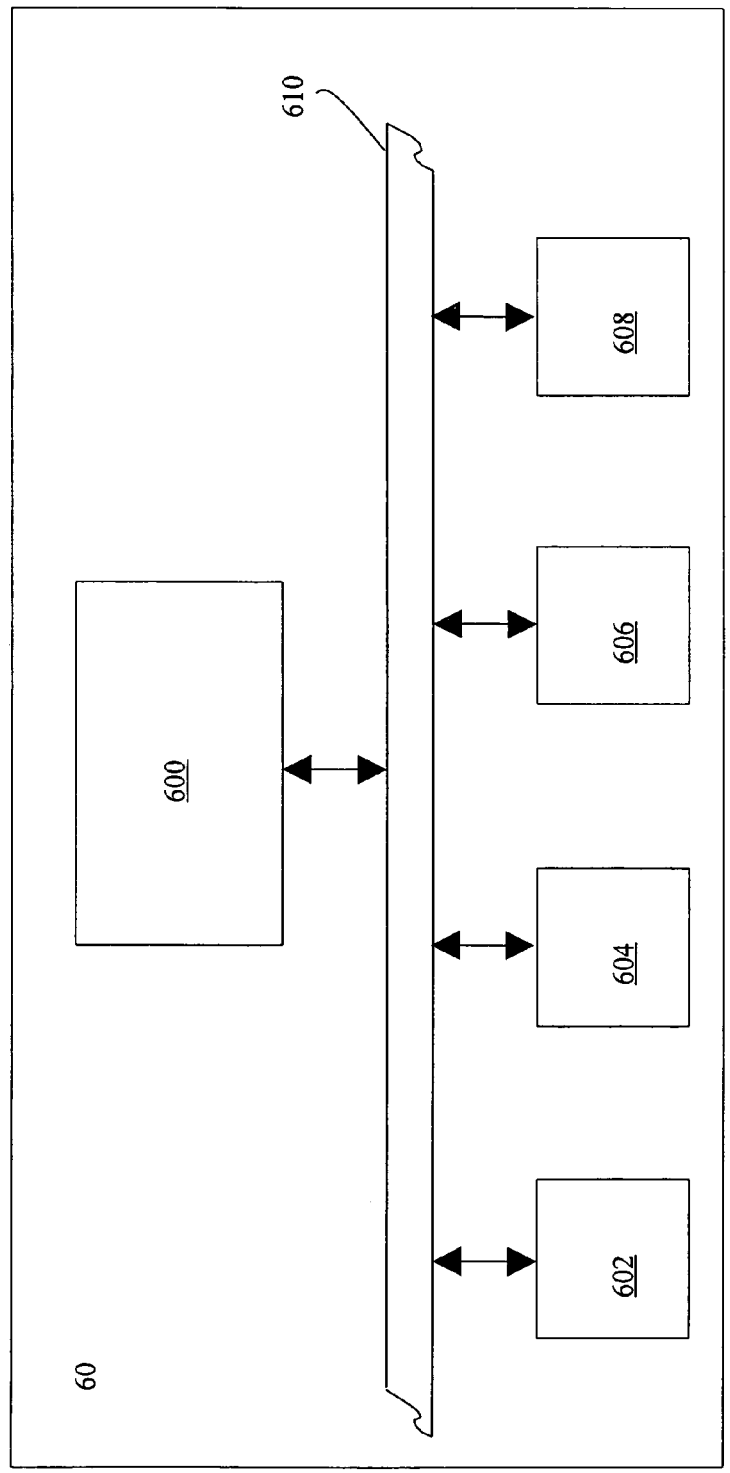
FIG. 6 illustrates a system that uses an integrated circuit package including a smart polymer composite.

FIG. 6 illustrates a schematic representation of one of many possible system embodiments. The package containing an integrated circuit 600 may include a smart polymer composite. In one embodiment, the package containing an integrated circuit 600 may include a smart polymer composite underfill material similar to that shown in FIG. 4. The integrated circuit may include a microprocessor or an application specific integrated circuit (ASIC). Alternatively, integrated circuits found in chipsets (e.g., graphics, sound, and control chipsets) or memory may also be packaged in accordance with embodiments of this invention.

For embodiments similar to that depicted in FIG. 6, the system 60 may also include a main memory 602, a graphics processor 604, a mass storage device 606, and an input/output module 608 coupled to each other by way of a bus 610, as shown. Examples of the memory 602 include but are not limited to static random access memory (SRAM) and dynamic random access memory (DRAM). Examples of the mass storage device 606 include but are not limited to a hard disk drive, a flash drive, a compact disk drive (CD), a digital versatile disk drive (DVD), and so forth. Examples of the input/output modules 608 include but are not limited to a keyboard, cursor control devices, a display, a network interface, and so forth. Examples of the bus 610 include but are not limited to a peripheral control interface (PCI) bus, PCI Express bus, Industry Standard Architecture (ISA) bus, and so forth. In various embodiments, the system 60 may be a wireless mobile phone, a personal digital assistant, a pocket PC, a tablet PC, a notebook PC, a desktop computer, a set-top box, an audio/video controller, a DVD player, a network router, a network switching device, or a server.

Although specific embodiments have been illustrated and described herein for purposes of description of an embodiment, it will be appreciated by those of ordinary skill in the art that a wide variety of alternate and/or equivalent implementations calculated to achieve similar purposes may be substituted for the specific embodiments shown and described without departing from the scope of the present disclosure. For example, an alternative embodiment may exist where a layer of smart polymer composite may be used between a die and integrated heat spreader. Another embodiment may apply a smart polymer composite between a package substrate and printed circuit board. Yet another embodiment may exist wherein a smart polymer composite forms an underfill of solder balls on a chip scale package.

Those with skill in the art will readily appreciate that the present invention may be implemented using a very wide variety of embodiments. This detailed description is intended to cover any adaptations or variations of the embodiments discussed herein. Therefore, it is manifestly intended that this invention be limited only by the claims and the equivalents thereof.

What is claimed is:

1. An apparatus comprising:
   a package including an integrated circuit, the package further including one or more regions of adjoining materials of different composition wherein one of the materials includes a polymeric material that includes a polymer matrix having at least one high energy region; and
   a mobile nanoparticle filler dispersed substantially throughout the polymer matrix with an increased concentration in the high energy region.

2. The apparatus of claim 1, wherein the integrated circuit further comprises a selected one of the group including microprocessor, a multiple core microprocessor, a graphics processor, a memory controller, an ASIC, a chipset, and a combination thereof.

3. The apparatus of claim 1, wherein the polymer matrix is substantially a selected one of the group consisting of an epoxy, a thermosetting urethane, a cyanourate ester, a silicone, polyimide, an acrylate, a bismaleimide, a liquid crystalline polymer, and a combination thereof.

4. The apparatus of claim 1, further comprising a modification of an interfacial surface of one or more of the group that includes the nanoparticle filler and the polymer matrix by modification means.

5. The apparatus of claim 1, wherein nanoparticle mobility within the polymer matrix may be partially stimulated by application of an impulse of a field potential selected from the group of field potentials consisting of temperature, electricity, magnetism, and a combination thereof.

6. The apparatus of claim 1, wherein a region of adjoining materials of different composition includes a delamination crack partially filled with nanoparticles, the delamination crack representing the high energy region.

7. The apparatus of claim 1, wherein a region within polymeric material includes a cohesive failure partially filled with nanoparticles, the cohesive failure representing the high energy region.

8. The apparatus of claim 1, wherein the dispersion of nanoparticles consists substantially of a nanoscale material selected from the group of organic and inorganic nanoparticles consisting of carbon nanotubes, nanoscale silica, nanoscale alumina, nanoscale titania, nanoscale zirconia, their equivalents, and a combination thereof.

9. The apparatus of claim 1, wherein a physical geometry of an individual exemplary nanoparticle is one selected from the group consisting of a sphere and a platelet.

10. The apparatus of claim 1, wherein the nanoparticle filler comprises less than approximately twenty percent by weight of the polymeric material.

11. The apparatus of claim 1, wherein a characteristic length of an exemplary nanoparticle of the nanoparticle filler is less than the radius of gyration of the polymeric material.

12. The apparatus of claim 1, wherein the mobile nanoparticle filler is dispersed substantially throughout the polymer matrix of a polymeric material that forms a selected one of the group consisting of a dielectric layer, an underfill, a die attach, a mold compound, an encapsulant other than a mold compound, a sealant, a stress compensation layer, a coating of a region of adjoining materials, and a combination thereof.

* * * * *